United States Patent
Hou et al.

(10) Patent No.: US 10,971,212 B2
(45) Date of Patent: Apr. 6, 2021

(54) MEMORY CHIP AND CONTROL METHOD THEREOF

(71) Applicant: Winbond Electronics Corp., Taichung (TW)

(72) Inventors: Chien-Ti Hou, Chiayi (TW); Wu-Chuan Cheng, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/811,908

(22) Filed: Mar. 6, 2020

(65) Prior Publication Data

US 2020/0294572 A1 Sep. 17, 2020

(30) Foreign Application Priority Data

Mar. 15, 2019 (TW) .................................. 108108796

(51) Int. Cl.
   *G11C 8/00* (2006.01)
   *G11C 11/408* (2006.01)
   *G11C 11/4091* (2006.01)
   *G11C 11/4074* (2006.01)
   (Continued)

(52) U.S. Cl.
   CPC ...... *G11C 11/4087* (2013.01); *G11C 11/4074* (2013.01); *G11C 11/4085* (2013.01); *G11C 11/4091* (2013.01); *G11C 11/4094* (2013.01); *G11C 11/40615* (2013.01)

(58) Field of Classification Search
   CPC . H01L 2924/00014; H01L 2924/00012; H01L 2224/73215; H01L 2224/32225; H01L 2224/48091; H01L 2224/4824; H01L 2924/181; H01L 2224/05599; H01L 2224/29099; H01L 2224/45099; H01L 2224/02166; G11C 11/4076; G11C 7/1006; G11C 7/1051; G11C 7/22; G11C 5/025; G11C 7/10; G11C 11/40618; G11C 7/1042; G11C 11/4097; G11C 7/1039; G11C 11/005; G11C 11/1675; G11C 11/2275; G11C 13/0033; G11C 13/0069; G11C 11/4085; G11C 7/1045
   USPC ......... 365/230.03, 200, 51, 230.06, 63, 201, 365/189.05, 222, 225.7, 189.011, 189.14, 365/189.15, 189.17, 191, 203, 205, 365/230.01, 230.02
   See application file for complete search history.

(56) References Cited

U.S. PATENT DOCUMENTS

2009/0097348 A1* 4/2009 Minzoni ............. G11C 11/4096
                                                365/230.03

* cited by examiner

*Primary Examiner* — Thong Q Le
(74) *Attorney, Agent, or Firm* — Birch, Stewart, Kolasch & Birch, LLP

(57) ABSTRACT

A memory chip including a memory bank, an address decoder circuit and a control circuit is provided. The memory bank includes a first sub-bank coupled to a first word line and a first access line and a second sub-bank coupled to a second word line and the first access line. The first sub-bank outputs data to the first access line via a first path. The second sub-bank outputs data to the first access line via a second path. The address decoder circuit decodes an external address to generate a row address and a column address. The control circuit controls the first path and the second path according to the row address and the column address. In response to the row address indicating the first word line and the column address indicating the first access line, the control circuit turns on the first path and turns off the second path.

10 Claims, 6 Drawing Sheets

(51) Int. Cl.
*G11C 11/4094* (2006.01)
*G11C 11/406* (2006.01)

MEMORY CHIP AND CONTROL METHOD THEREOF

CROSS REFERENCE TO RELATED APPLICATIONS

This Application claims priority of Taiwan Patent Application No. 108108796, filed on Mar. 15, 2019, the entirety of which is incorporated by reference herein.

BACKGROUND OF THE INVENTION

Field of the Invention

The invention relates to a memory chip, and more particularly to a memory chip that simultaneously performs an access operation and a refresh operation on a single memory bank.

Description of the Related Art

Generally, Dynamic Random Access Memory (DRAM) has various capacitors to store data. However, the voltage stored in capacitors may be lost over time. Therefore, voltage stored in a capacitor is refreshed at fixed time intervals so that the capacitor is able to store correction data. While capacitors are being refreshed, a DRAM cannot output data or store data.

BRIEF SUMMARY OF THE INVENTION

In accordance with an embodiment, a memory chip comprises at least one memory bank, an address decoder circuit and a control circuit. The memory bank comprises a first sub-bank and a second sub-bank. The first sub-bank comprises a first memory cell coupled to a first word line and a first access line. The first memory cell outputs data to the first access line via a first path. The second sub-bank comprises a second memory cell coupled to a second word line and the first access line. The second memory cell outputs data to the first access line via a second path. The address decoder circuit decodes an external address to generate a row address and a column address. The control circuit controls the first path and the second path according to the row address and the column address. In response to the row address indicating the first word line and the column address indicating the first access line, the control circuit turns on the first path and turns off the second path.

A control method for a memory chip is provided. The memory chip comprises a memory bank. The memory bank comprises a first sub-bank and a second sub-bank. The first sub-bank comprises a first memory cell coupled to a first word line and an access line. The second sub-bank comprises a second memory cell coupled to a second word line and the access line. An exemplary embodiment of the control method is described in the following paragraphs. An external address is decoded to generate a row address and a column address. In response to the row address indicating the first word line and the column address indicating the access line, an access signal is provided to the first word line, a refresh signal is provided to the second word line, a first path is turned on, and a second path is turned off. In response to the first path being turned on, the first memory cell outputs data to the access line via the first path. In response to the second path being turned off, the second memory cell does not output data to the access line via the second path.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
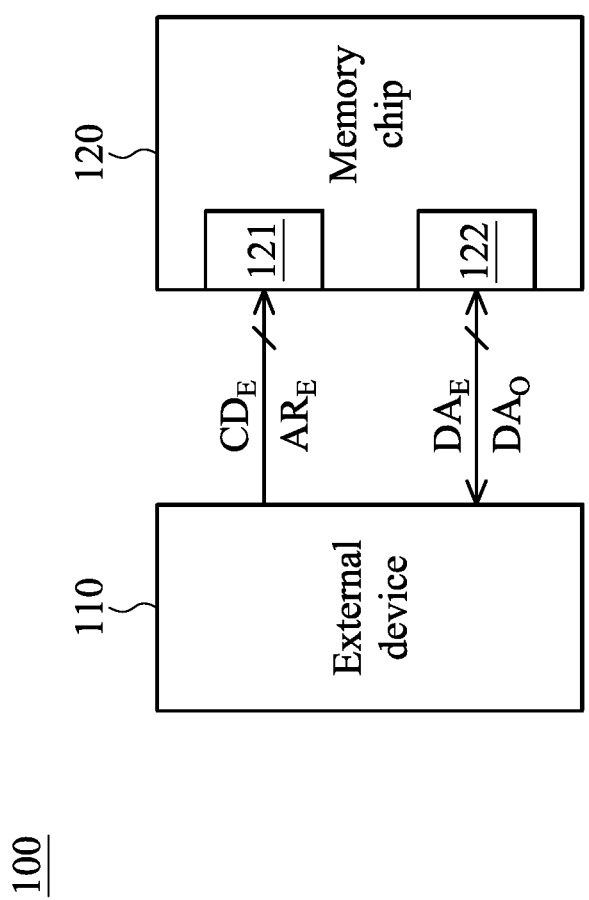
FIG. 1 is a schematic diagram of an exemplary embodiment of an access system according to various aspects of the present disclosure.

FIG. 1 is a schematic diagram of an exemplary embodiment of an access system according to various aspects of the present disclosure. As shown in FIG. 1, the access system 100 comprises an external device 110 and a memory chip 120. The external device 110 is disposed independently outside of the memory chip 120. In the present disclosure, the kind of external device 110 is not limited. In one embodiment, the external device 110 is a memory controller. The external device 110 sends an external command $CD_E$ and an external address $AR_E$.

The memory chip 120 decodes the external command $CD_E$ to determine the type of external command $CD_E$. For example, when the external command $CD_E$ is a write command, the memory chip 120 operates in a write mode. In the write mode, the memory chip 120 receives and stores external data $DA_E$ provided by the external device 110 according to the external address $AR_E$. When the external command $CD_E$ is a read command, the memory chip 120 operates in a read mode. In the read mode, the memory chip 120 outputs data $DA_O$ to the external device 110 according to the external address $AR_E$.

In this embodiment, the memory chip 120 comprises a command address bus 121 and a data bus 122. The command address bus 121 is configured to receive the external command $CD_E$ and the external address $AR_E$. In one embodiment, the command address bus 121 uses a parallel transmission protocol or a serial transmission protocol to receive the external command $CD_E$ and the external address $AR_E$. The data bus 122 is configured to transmit the external data $DA_E$ and the data $DA_O$. In one embodiment, the data bus 122 uses a parallel transmission protocol or a serial transmission protocol to receive the external data $DA_E$ provided by the external device 110 or to output the data $DA_O$ to the external device 110.

Figure 2:
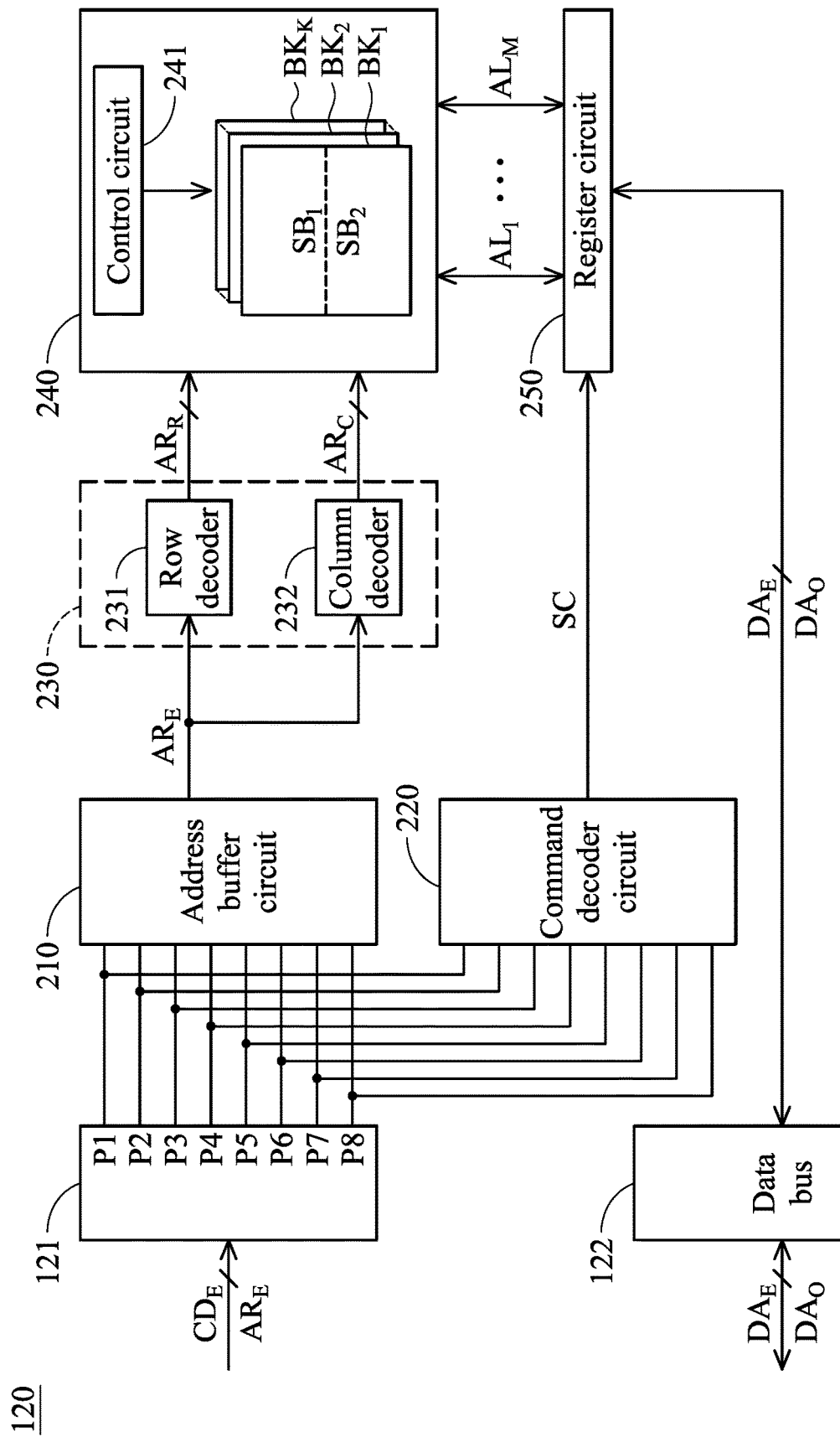
FIG. 2 is a schematic diagram of an exemplary embodiment of a memory chip according to various aspects of the present disclosure.

FIG. 2 is a schematic diagram of an exemplary embodiment of the memory chip according to various aspects of the present disclosure. As shown in FIG. 2, the memory chip 120 comprises the command address bus 121, the data bus 122, an address buffer circuit 210, a command decoder circuit 220, an address decoder circuit 230, a storage circuit 240 and a register circuit 250.

In this embodiment, the command address bus 121 provides the external address $AR_E$ to the address buffer circuit 210 via pins P1-P8 and provides the external command $CD_E$ to the command decoder circuit 220 via the pins P1-P8. In other embodiments, the command address bus 121 uses more pins or fewer pins.

The address buffer circuit 210 is coupled to the command address bus 121 to provisionally store the external address $AR_E$. In this embodiment, the address buffer circuit 210 transmits the external address $AR_E$ to the address decoder circuit 230. The circuit structure of address buffer circuit 210 is not limited in the present disclosure. In one embodiment, the address buffer circuit 210 comprises a plurality of registers (not shown) to store the external address $AR_E$.

The address decoder circuit 230 is coupled to the address buffer circuit 210 to receive the external address $AR_E$. In this embodiment, the address decoder circuit 230 decodes the external address $AR_E$ to generate a row address $AR_R$ and a column address $AR_C$. The circuit structure of address decoder circuit 230 is not limited in the present disclosure. In one embedment, the address decoder circuit 230 comprises a row decoder 231 and a column decoder 232. The row decoder 231 decodes the external address $AR_E$ to generate the row address $AR_R$. the column decoder 232 decodes the external address $AR_E$ to generate the column address $AR_C$.

The storage circuit 240 is coupled to the address decoder circuit 230 to receive the row address $AR_R$ and the column address $AR_C$. In this embodiment, the storage circuit 240 comprises a control circuit 241 and memory banks $BK_1$~$BK_R$. In one embodiment, a portion of the control circuit 241 is independently disposed out of the memory banks $BK_1$~$BK_R$ and the other of the control circuit 241 is integrated into the memory banks $BK_1$~$BK_R$. In another embodiment, the control circuit 241 is completely integrated into the memory banks $BK_1$~$BK_K$.

The control circuit 241 controls the operations of the memory banks $BK_1$~$BK_R$ according to the row address $AR_R$ and the column address $AR_C$. In this embodiment, each of the memory banks $BK_1$~$BK_R$ is divided into two sub-banks. Taking the memory bank $BK_1$ as an example, the memory bank $BK_1$ is divided into the sub-banks $SB_1$ and $SB_2$, but the disclosure is not limited thereto. In other embodiments, each of the memory banks $BK_1$~$BK_R$ is divided into more sub-banks. In some embodiments, at least one of the memory banks $BK_1$~$BK_R$ does not been divided into various sub-banks.

Since the features of the memory banks $BK_1$~$BK_R$ are the same, the memory bank $BK_1$ is given as an example. When the row address $AR_R$ indicates the sub-bank $SB_1$, the control circuit 241 directs the sub-bank $SB_1$ to output data to at least one of the access lines $AL_1$-$AL_M$ according to the column address $AR_C$. Therefore, the sub-bank $SB_1$ operates in an access mode. In the access mode, the sub-bank $SB_1$ performs an access operation. For example, the sub-bank $SB_1$ receives the external data $DA_E$ provided by the register circuit 250 via the access lines $AL_1$-$AL_M$ or provides the data $DA_O$ to the register circuit 250 via the access lines $AL_1$-$AL_M$.

When the sub-bank $SB_1$ operates in the access mode, since the row address $AR_R$ does not indicate the sub-bank $SB_2$, the control circuit 241 cuts the paths between the sub-bank $SB_2$ and the access lines $AL_1$-$AL_M$. Therefore, the sub-bank $SB_2$ does not output data to the access lines $AL_1$-$AL_M$ and does not receive the data from the access lines $AL_1$-$AL_M$. In one embodiment, the control circuit 241 directs the sub-bank $SB_2$ to perform a refresh operation to charge the capacitors in the memory bank $BK_2$.

In other embodiments, when the row address $AR_R$ indicates the sub-bank $SB_2$, the control circuit 241 turns on the paths between the memory bank $BK_2$ and the access lines $AL_1$-$AL_M$. Therefore, the sub-bank $SB_2$ operates in the access mode. In the access mode, the sub-bank $SB_2$ performs the access operation. For example, the sub-bank $SB_2$ receives the data provided by the register circuit 250 or outputs data to the register circuit 250 via the turned-on paths. At this time, since the row address $AR_R$ does not indicate the sub-bank $SB_1$, the control circuit 241 does not turn on the paths between the sub-bank $SB_1$ and the access lines $AL_1$-$AL_M$. Therefore, the sub-bank $SB_1$ does not receive the data provided by the register circuit 250 via the access lines $AL_1$-$AL_M$ and does not output data to the register circuit 250 via the access lines $AL_1$-$AL_M$. In one embodiment, the control circuit 241 may direct the sub-bank $SB_1$ to perform the refresh operation.

In this embodiment, for the same memory bank (e.g., $SB_1$), a sub-bank (e.g., $SB_1$) performs an access operation, and simultaneously, the other sub-bank (e.g., $SB_2$) performs a refresh operation in order to improve the accuracy of the data stored in the address decoder circuit 230. Furthermore, since the paths between the sub-bank $SB_1$ and the access lines $AL_1$-$AL_M$ are turned on and the paths between the sub-bank $SB_2$ and the access lines $AL_1$-$AL_M$ are cut, the sub-bank $SB_1$ is capable of immediately outputting data to increase the performance of the storage circuit 240.

In other embodiments, at least one of the memory banks $BK_1$~$BK_K$ does not simultaneously perform the access operation and the refresh operation. Taking the memory bank $BK_2$ as an example, assume that the memory bank $BK_2$ is not divided into two sub-banks. In this case, when one memory cell in the memory bank $BK_2$ performs the access operation, the other memory cells in the memory bank $BK_2$ do not perform the refresh operation. Similarly, when one memory cell in the memory bank $BK_2$ performs the refresh operation, the others do not perform the access operation.

The command decoder circuit 220 decodes the external command $CD_E$ to determine the type of external command $CD_E$, such as a read command, a write command or a set command. The command decoder circuit 220 generates a control signal SC according to the type of external command $CD_E$.

The register circuit 250 is configured to temporarily store the external data $DA_E$ provided by the data bus 122 and temporarily store the data $DA_O$ provided by the storage circuit 240. In one embodiment, when the external command $CD_E$ is a read command, the command decoder circuit 220 generates the control signal SC to direct the register circuit 250 to receive the data $DA_O$ provided by the storage circuit 240 via the access lines $AL_1$-$AL_M$ and output the data $DA_O$ via the data bus 122. However, when the external command $CD_E$ is a write command, the command decoder circuit 220 utilizes the control signal SC to direct the register circuit 250 to receive the external data $DA_E$ provided by the data bus 122 and provide the external data $DA_E$ to the storage circuit 240 via the access lines $AL_1$-$AL_M$.

Figure 3:
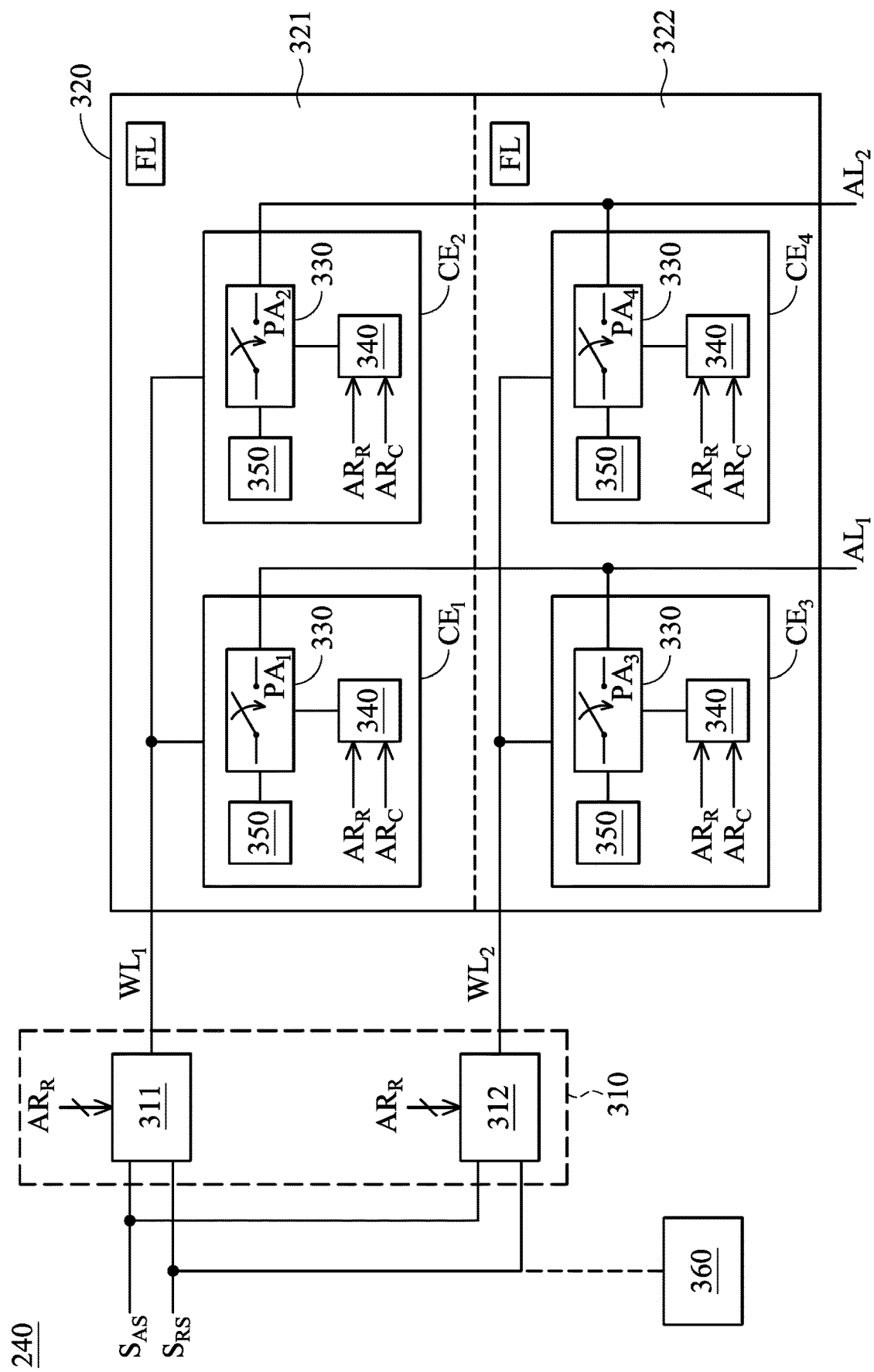
FIG. 3 is a schematic diagram of an exemplary embodiment of a storage circuit according to various aspects of the present disclosure.

FIG. 3 is a schematic diagram of an exemplary embodiment of the storage circuit 240 according to various aspects of the present disclosure. For clarity, only a memory bank is shown in FIG. 3, but the disclosure is not limited thereto. In other embodiments, the storage circuit 240 comprises more memory banks. As shown in FIG. 3, the storage circuit 240 comprises a selection circuit 310 and a memory bank 320. In this embodiment, the memory bank 320 is divided into sub-banks 321 and 322. As shown in FIG. 3, the sub-bank 321 comprises memory cells $CE_1$ and $CE_2$. The sub-bank 322 comprises memory cells $CE_3$ and $CE_4$. In other embodiments, each of the sub-banks 321 and 322 comprises more memory cells.

The memory cell $CE_1$ is coupled to the word line $WL_1$ and the access line $AL_1$ and receives the row address $AR_R$ and the column address $AR_C$. In this embodiment, the memory cell $CE_1$ comprises a storage circuit 350, an access circuit 330 and a logic circuit 340. The storage circuit 350 is configured to store data. The structure of storage circuit 350 is not limited in the present disclosure. In one embodiment, the storage circuit 350 comprises a capacitor. In this case, the voltage stored in the capacitor represents the data stored in the memory cell $CE_1$.

The access circuit 330 is coupled to the storage circuit 350 and the access line $AL_1$ to write the data from the access line $AL_1$ to the storage circuit 350 or provide the data stored in the storage circuit 350 to the access line $AL_1$. In this embodiment, the access circuit 330 comprises a path $PA_1$. When the path $PA_1$ is turned on, the access circuit 330 provides the data to the access line $AL_1$ or receive the data from the access line $AL_1$. When the path $PA_1$ is turned off, the access circuit 330 does not provide the data to the access line $AL_1$. In the present disclosure, the structure of access circuit 330 is not limited. The operation of the access circuit 330 is described in greater detail with reference to FIG. 4A.

The logic circuit 340 turns on or off the path $PA_1$ according to the row address $AR_R$ and the column address $AR_C$. For example, when the row address $AR_R$ indicates the word line $WL_1$ and the column address $AR_C$ indicates the access line $AL_1$, the access circuit 330 turns on the path $PA_1$. However, when the row address $AR_R$ does not indicate the word line $WL_1$ or the column address $AR_C$ does not indicate the word line $WL_1$, the access circuit 330 turns off the path $PA_1$. In one embodiment, the logic circuit 340 and the selection circuit 310 serves as the control circuit 241 in FIG. 2. The structure of logic circuit 340 is not limited in the present disclosure. The operation of logic circuit 340 is described in greater detail with reference to FIG. 4A.

In FIG. 3, the memory cell $CE_2$ is coupled to the word line $WL_1$ and the access line $AL_2$. The memory cell $CE_3$ is coupled to the word line $WL_2$ and the word line $WL_1$. The memory cell $CE_4$ is coupled to the word line $WL_2$ and the access line $AL_2$. Since the circuit structure of each of the memory cells $CE_2$~$CE_4$ is the same as the circuit structure of the memory cell $CE_1$, the descriptions of the memory cells $CE_2$~$CE_4$ are omitted.

In on embodiment, when the row address $AR_R$ indicates the word line $WL_1$ and the column address $AR_C$ indicates the access line $AL_1$, only the memory cell $CE_1$ in the sub-bank 321 performs an access operation. In this case, each of the memory cells (e.g., $CE_3$ and $CE_4$) in the sub-bank 322 performs a refresh operation. In one embodiment, the memory cell $CE_2$ in the sub-bank 321 also performs the refresh operation.

The selection circuit 310 receives an access signal $S_{AS}$ and a refresh signal $S_{RS}$ and outputs the access signal $S_{AS}$ or the refresh signal $S_{RS}$ according to the row address $AR_R$ to control the operation modes of the memory cells $CE_1$~$CE_4$. For example, when the row address $AR_R$ indicates the word line $WL_1$, the selection circuit 310 outputs the access signal $S_{AS}$ to the word line $WL_1$ and outputs the refresh signal $S_{RS}$ to the word line $WL_2$. At this time, if the path $PA_1$ of the memory cell $CE_1$ is turned on, the memory cell $CE_1$ enters an access mode to store or output data. In this case, each of the memory cells $CE_3$ and $CE_4$ enters a refresh mode to remain the data stored in the memory cells $CE_3$ and $CE_4$. In one embodiment, the memory cell $CE_2$ also enters the refresh mode.

However, when the row address $AR_R$ indicates the word line $WL_2$, the selection circuit 310 outputs the access signal $S_{AS}$ to the word line $WL_2$ and outputs the refresh signal $S_{RS}$ to the word line $WL_1$. At this time, if the path $PA_3$ of the memory cell $CE_3$ is turned on, the memory cell $CE_3$ enters an access mode to store or output data. In such case, each of the memory cells $CE_1$ and $CE_2$ enters a refresh mode to remain the data stored in the memory cells $CE_1$ and $CE_2$. In one embodiment, the memory cell $CE_4$ also enters the refresh mode.

The present disclosure does not limit how the selection circuit 310 utilizes the row address $AR_R$ to determine which sub-bank the row address $AR_R$ indicates. In one embodiment, the row address $AR_R$ has a plurality of bits. The selection circuit 310 utilizes the logic values of at least one first specific bit (e.g., the most significant bit (MSB)) of the row address $AR_R$ to determine that the row address $AR_R$ indicates the sub-bank 321 or 322. Additionally, the selection circuit 310 utilizes the logic values of at least one of second specific bits (e.g., the least significant bit (LSB) and a bit adjacent the LSB) of the row address $AR_R$ to determine that the row address $AR_R$ indicates the word line $WL_1$ or $WL_2$. In other embodiments, the logic circuit 340 determines that the column address $AR_C$ indicates the access line $AL_1$ or $AL_2$ according to the logic value of at least one specific bit of the column address $AR_C$.

In this embodiment, the selection circuit 310 comprises selectors 311 and 312. The selector 311 outputs the access signal $S_{AS}$ or the refresh signal $S_{RS}$ to the word line $WL_1$ according to the row address $AR_R$. For example, when the row address $AR_R$ points to the word line $WL_1$, the selector 311 outputs the access signal $S_{AS}$ to the word line $WL_1$. When the row address $AR_R$ does not point to the word line $WL_1$, the selector 311 outputs the refresh signal $S_{RS}$ to the word line $WL_1$. The circuit structure of the selector 311 is not limited in the present disclosure. In one embodiment, the selector 311 comprises a multiplexer. The selector 312 outputs the access signal $S_{AS}$ or the refresh signal $S_{RS}$ to the word line $WL_2$ according to the row address $AR_R$. Since the feature of the selector 312 is the same as the feature of the selector 311, the description of the feature of the selector 312 is omitted.

In other embodiments, the storage circuit 240 further comprises a refresh counter 360 to generate a refresh signal $S_{RS}$. In this case, the refresh counter 360 sends the refresh signal $S_{RS}$ every a fixed time. Furthermore, the present disclosure does not limit the source of the access signal $S_{AS}$. In some embodiments, the access signal $S_{AS}$ is generated by the address decoder circuit 230 shown in FIG. 2.

In some embodiments, when the memory bank 321 does not perform a refresh operation within a predetermined period, the selection circuit 310 provides a refresh signal $S_{RS}$ to the word line (e.g., WL1) of the sub-bank 321 to direct the memory cells (e.g., $CE_1$ and $CE_2$) of the sub-bank 321 to perform a refresh operation. In one embodiment, the sub-bank 321 comprises a counter FL. The counter FL has a count value. When the count value reaches a predetermined value, it means that the sub-bank 321 has not performed a refresh operation within a predetermined period. Therefore, the selection circuit 310 provides a refresh signal $S_{RS}$ to the word line $WL_1$. After the sub-bank 321 performs the refresh operation, the count value of the counter FL is reset to an initial value, such as 0.

Figure 4A:
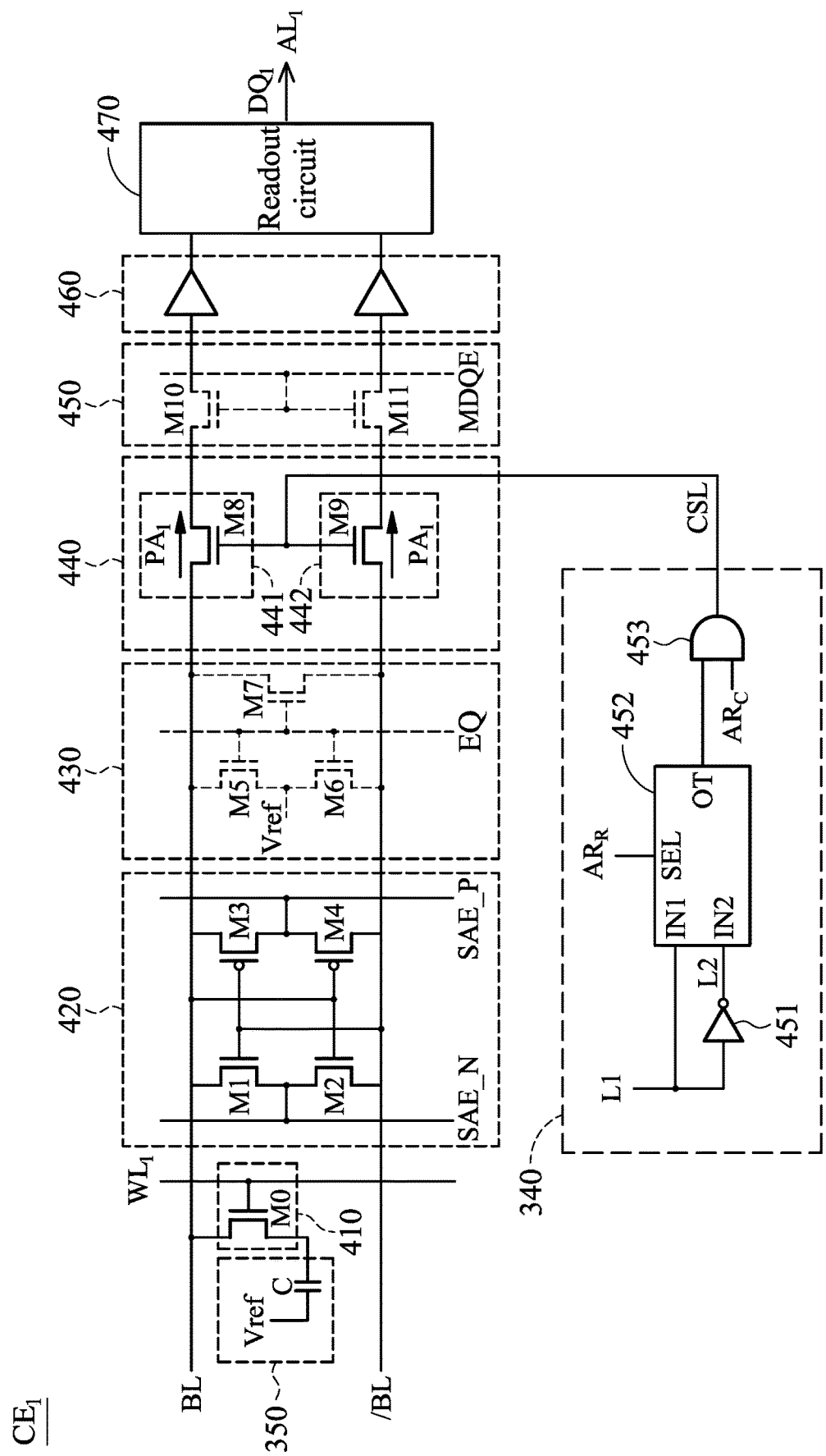
FIG. 4A is a schematic diagram of an exemplary embodiment of a memory cell according to various aspects of the present disclosure.

FIG. 4A is a schematic diagram of an exemplary embodiment of the memory cell according to various aspects of the present disclosure. Since the circuit structures of the memory cells in each sub-bank are the same, only one memory cell (e.g. $CE_1$ shown in FIG. 3) is shown in FIG. 4A. In this embodiment, the memory cell $CE_1$ comprises a storage circuit 350, a control switch 410, an amplifier circuit 420, an equalizer 430, a switch circuit 440, a buffer circuit 450, an amplifier circuit 460, a readout circuit 470 and a logic circuit 340. In other embodiments, at least one of the equalizer 430 and the readout circuit 470 is omitted.

The storage circuit 350 comprises a capacitor C. The capacitor C receives a reference voltage Vref. In one embodiment, the reference voltage Vref is a half of the operation voltage (not shown) of the memory chip 120.

The control switch 410 is coupled to the word line $WL_1$ and the bit line BL. In one embodiment, the control switch 410 is configured to transmit the voltage of the bit line BL to the capacitor C or read the voltage of the capacitor C. In this embodiment, the control switch 410 is a transistor M0. The gate of the transistor M0 is coupled to the word line $WL_1$. The first source/drain of the transistor M0 is coupled to the bit line BL. The second source/drain of the transistor M0 is coupled to the capacitor C. In other embodiments, the transistor M0 is a P-type transistor.

The amplifier circuit 420 amplifies the voltage difference between the voltage of the bit line BL and the voltage of the bit line /BL to generate amplified data. In one embodiment, the memory cells coupled to the same access line are coupled to the same bit line. Taking FIG. 3 as an example, the memory cells $CE_1$ and $CE_3$ are coupled to the same bit lines BL and /BL. In this case, the bit lines BL and /BL of the memory cell $CE_1$ are different from the bit lines BL and /BL of the memory cell $CE_2$.

The structure of the amplifier circuit 420 is not limited in the present disclosure. In one embodiment, the amplifier circuit 420 is a sense amplifier (SA) or a differential amplifier. In this embodiment, the amplifier circuit 420 comprises transistors M1~M4. The gate of the transistor M1 is coupled to the bit line /BL. The first source/drain of the transistor M1 is coupled to the bit line BL. The second source/drain of the transistor M1 receives the control signal SAE_N. The gate of the transistor M2 is coupled to the bit line BL. The first source/drain of the transistor M2 receives the control signal SAE_N. The second source/drain of the transistor M2 is coupled to the bit line /BL. The gate of the transistor M3 is coupled to the bit line /BL. The first source/drain of the transistor M3 is coupled to the bit line BL. The second source/drain of the transistor M3 receives the control signal SAE_P. The gate of the transistor M4 is coupled to the bit line BL. The first source/drain of the transistor M4 receives the control signal SAE_P. The second source/drain of the transistor M4 is coupled to the bit line /BL. In this embodiment, the transistors M1 and M2 are N-type transistors, and the transistors M3 and M4 are P-type transistors.

The equalizer 430 is configured to reduce the signal distortions in the bit lines BL and /BL. When the equalization signal EQ is asserted, the equalizer 430 connects the bit line BL to the bit line /BL. Therefore, the voltage level of the bit line BL is the same as the bit line /BL. When the equalization signal EQ is not asserted, the equalizer 430 stops working. Therefore, the voltage level of the bit line BL is different from the voltage level of the bit line /BL.

In this embodiment, the equalizer 430 comprises transistors M5~M7. The gate of the transistor M5 receives the equalization signal EQ. The first source/drain of the transistor M5 is coupled to the bit line BL. The second source/drain of the transistor M5 receives the reference voltage Vref. The gate of the transistor M6 receives the equalization signal EQ. The first source/drain of the transistor M6 receives the reference voltage Vref. The second source/drain of the transistor M6 is coupled to the bit line /BL. The gate of the transistor M7 receives the equalization signal EQ. The first source/drain of the transistor M7 is coupled to the bit line BL. The second source/drain of the transistor M7 is coupled to the bit line /BL. Each of the transistors M5~M7 is a N-type transistor, but the disclosure is not limited thereto. In other embodiments, each of the transistors M5~M7 is a P-type transistor. In some embodiments, the equalizer 430 is omitted.

The switch circuit 440 is coupled to the bit line BL and the bit line /BL and determines whether to turn on the path $PA_1$ according to a row selection signal CSL. For example, when the row selection signal CSL is asserted, the switch circuit 440 turns on the path $PA_1$ to transmit the signal of the bit line BL and the signal of the bit line /BL to the amplifier circuit 460. However, when the row selection signal CSL is not asserted, the switch circuit 440 turns off the path $PA_1$. Therefore, the data stored in the memory cell $CE_1$ does not been transmitted to the access line $AL_1$.

In this embodiment, the switch circuit 440 comprises switches 441 and 442. The switch 441 is coupled between the bit line BL and the amplifier circuit 460. The switch 442 is coupled between the bit line /BL and the amplifier circuit 460. The kinds of switches 441 and 442 are not limited in the present disclosure. In this embodiment, the switch 441 is a transistor M8, and the switch 442 is a transistor M9. The gate of the transistor M8 receives the row selection signal CSL. The first source/drain of the transistor M8 is coupled to the bit line BL. The second source/drain of the transistor M8 is coupled to the amplifier circuit 460. The gate of the transistor M9 receives the row selection signal CSL. The first source/drain of the transistor M9 is coupled to the bit line /BL. The second source/drain of the transistor M9 is coupled to the amplifier circuit 460. As shown in FIG. 4A, the transistors M8 and M9 are N-type transistors. In other embodiments, the transistors M8 and M9 are P-type transistors.

In this embodiment, the row selection signal CSL is generated by the logic circuit 340. The logic circuit 340 generates the row selection signal CSL according to the row address $AR_R$ and the column address $AR_C$. For example, when the row address $AR_R$ points to the word line $WL_1$ and the column address $AR_C$ points to the access line $AL_1$, the logic circuit 340 asserts the row selection signal CSL. However, when the row address $AR_R$ does not point to the word line $WL_1$ or the column address $AR_C$ does not point to the access line $AL_1$, the logic circuit 340 does not assert the row selection signal CSL.

The present disclosure does not limit the structure of the logic circuit 340. In this embodiment, the logic circuit 340 comprises logic gates 451~453. The logic gate 451 generates the voltage level L2 according to the voltage level L1. In this embodiment, the voltage level L1 is opposite the voltage level L2. For example, when the voltage level L1 is a high level, the voltage level L2 is a low level. When the voltage level L1 is a low level, the voltage level L2 is a high level. In one embodiment, the logic gate 451 is an inverter.

The logic gate 452 has input terminals IN1 and IN2, a selection terminal SEL and an output terminal OT. The input terminal IN1 receives the voltage level L1. The input terminal IN2 is coupled to the logic gate 451 to receive the voltage level L2. The selection terminal SEL is configured to receive the row address $AR_R$. When the row address $AR_R$ points to the word line WL$_1$, the output terminal OT outputs the voltage level L1. When the row address AR$_R$ does not point to the word line WL$_1$, the output terminal OT outputs the voltage level L2. In one embodiment, the logic gate 452 is a selector, such as a multiplexer.

The logic gate 453 is coupled to the output terminal OT and receives the column address AR$_C$. When the logic gate 452 outputs the voltage level L1 (i.e., the row address AR$_R$ points to the word line WL$_1$) and the column address AR$_C$ points to the access line AL$_1$, the logic gate 453 asserts the row selection signal CSL to turn on the switches 441 and 442. However, when the logic gate 452 outputs the voltage level L2 (i.e., the row address AR$_R$ does not point to the word line WL$_1$) or the column address AR$_C$ does not point to the access line AL$_1$, the logic gat 453 does not assert the row selection signal CSL. In one embodiment, the logic gate 453 is an AND gate.

The buffer circuit 450 is configured to increase the strength of the data transmitted by the path PA$_1$. In this embodiment, the buffer circuit 450 comprises transistors M10 and M11. The gate of the transistor M10 receives the control signal MDQE. The first source/drain of the transistor M10 is coupled to the switch 441. The second source/drain of the transistor M10 is coupled to the amplifier circuit 460. The gate of the transistor M11 receives the control signal MDQE. The first source/drain of the transistor M11 is coupled to the switch 442. The second source/drain of the transistor M11 is coupled to the amplifier circuit 460. In other embodiments, the buffer circuit 450 can be omitted. In such case, the switch circuit 440 is directly connected to the amplifier circuit 460.

The amplifier circuit is coupled between the buffer circuit 450 and the readout circuit 470. When the buffer circuit 450 is omitted, the amplifier circuit 460 is coupled between the switch circuit 440 and the readout circuit 470. In this embodiment, when the path PA$_1$ is turned on, the amplifier circuit 460 amplifies the signals of the bit line BL and the bit line /BL and provides the amplified results to the readout circuit 470. The structure of the amplifier circuit 460 is not limited in the present disclosure. In one embodiment, the amplifier circuit is a sense amplifier or a differential amplifier.

The readout circuit 470 generates data DQ$_1$ to the access line AL$_1$ according to the voltage difference between the voltage of the bit line BL and the voltage of the bit line /BL. In one embodiment, the data DQ$_1$ is temporarily stored in a register circuit (e.g., 250). In other embodiments, the readout circuit 470 generates a pair of differential signals to the bit line BL and the bit line /BL.

Figure 4B:
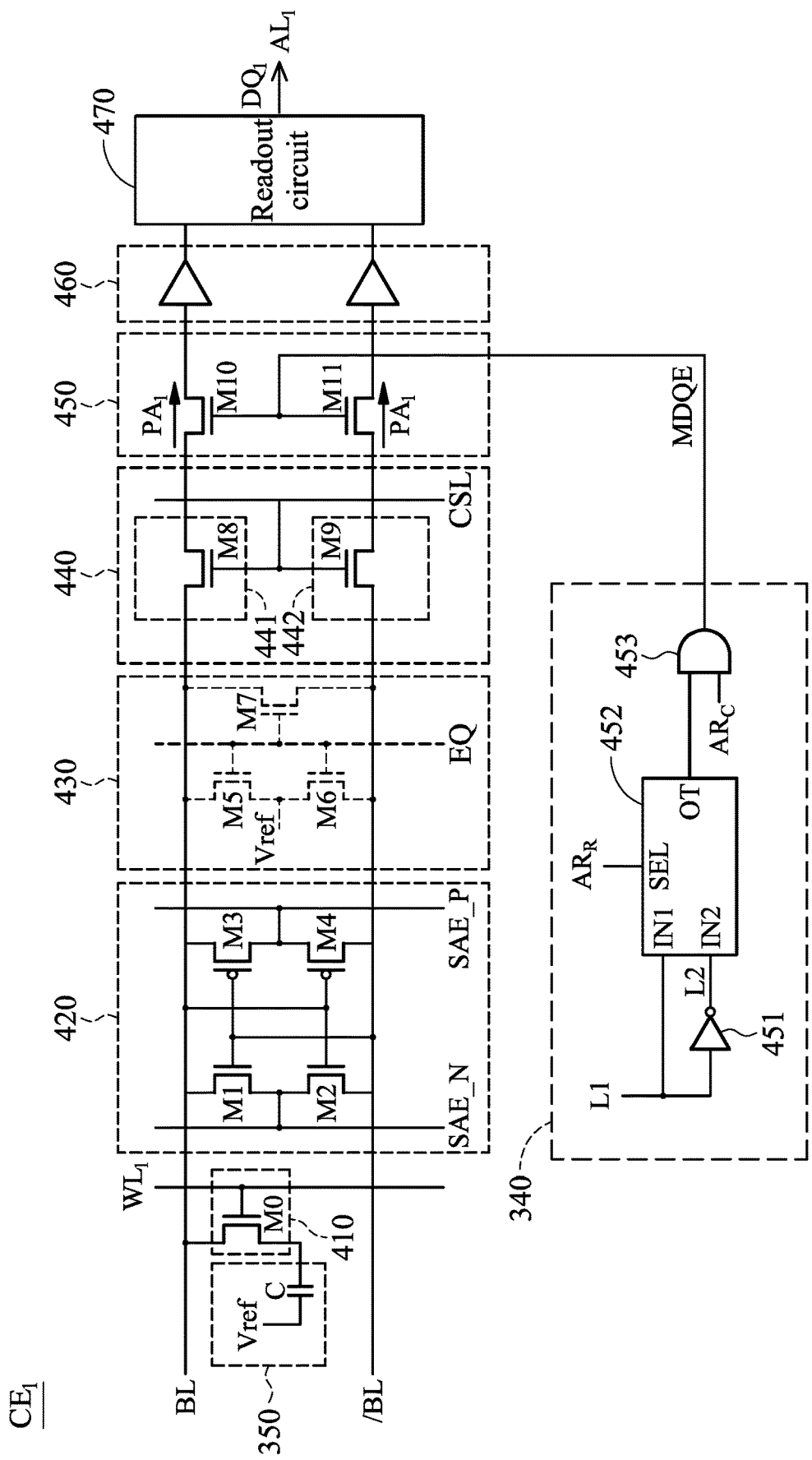
FIG. 4B is a schematic diagram of another exemplary embodiment of the memory cell according to various aspects of the present disclosure.

FIG. 4B is a schematic diagram of another exemplary embodiment of the memory cell according to various aspects of the present disclosure. FIG. 4B is similar to FIG. 4A with the exception that the control signal MDQE shown in FIG. 4B is generated by the logic circuit 340. In other words, the logic circuit 340 in FIG. 4A determines whether to assert the switch circuit 440, and the logic circuit 340 in FIG. 4B determines whether to assert the buffer circuit 450. In this embodiment, the logic circuit 340 generates the control signal MDQE according to the row address AR$_R$ and the column address AR$_C$. For example, when the row address AR$_R$ points to the word line WL$_1$ and the column address AR$_C$ points to the access line AL$_1$, the logic circuit 340 asserts the control signal MDQE to turn on the transistors M10 and M11. Therefore, the path PA$_1$ is turned on. When the row address AR$_R$ does not point to the word line WL$_1$ or the column address AR$_C$ does not point to the access line AL$_1$, the logic circuit 340 does not assert the control signal MDQE. Therefore, the transistors M10 and M11 are turned off.

The row selection signal CSL received by the switch circuit 440 may be generated by the column decoder 232 shown in FIG. 2. In this case, the column decoder 232 asserts or de-asserts the row selection signal CSL according to the external address AR$_E$. For example, when the external address AR$_E$ points to the memory cell CE$_1$, the column decoder 232 asserts the row selection signal CSL. Therefore, the switch circuit 440 transmits the signals on the bit lines BL and /BL to the buffer circuit 450. When the external address AR$_E$ does not point to the memory cell CE$_1$, the column decoder 232 does not assert the row selection signal CSL. Therefore, the switch circuit 440 stops transmitting the signals on the bit lines BL and /BL to the buffer circuit 450.

Figure 5:
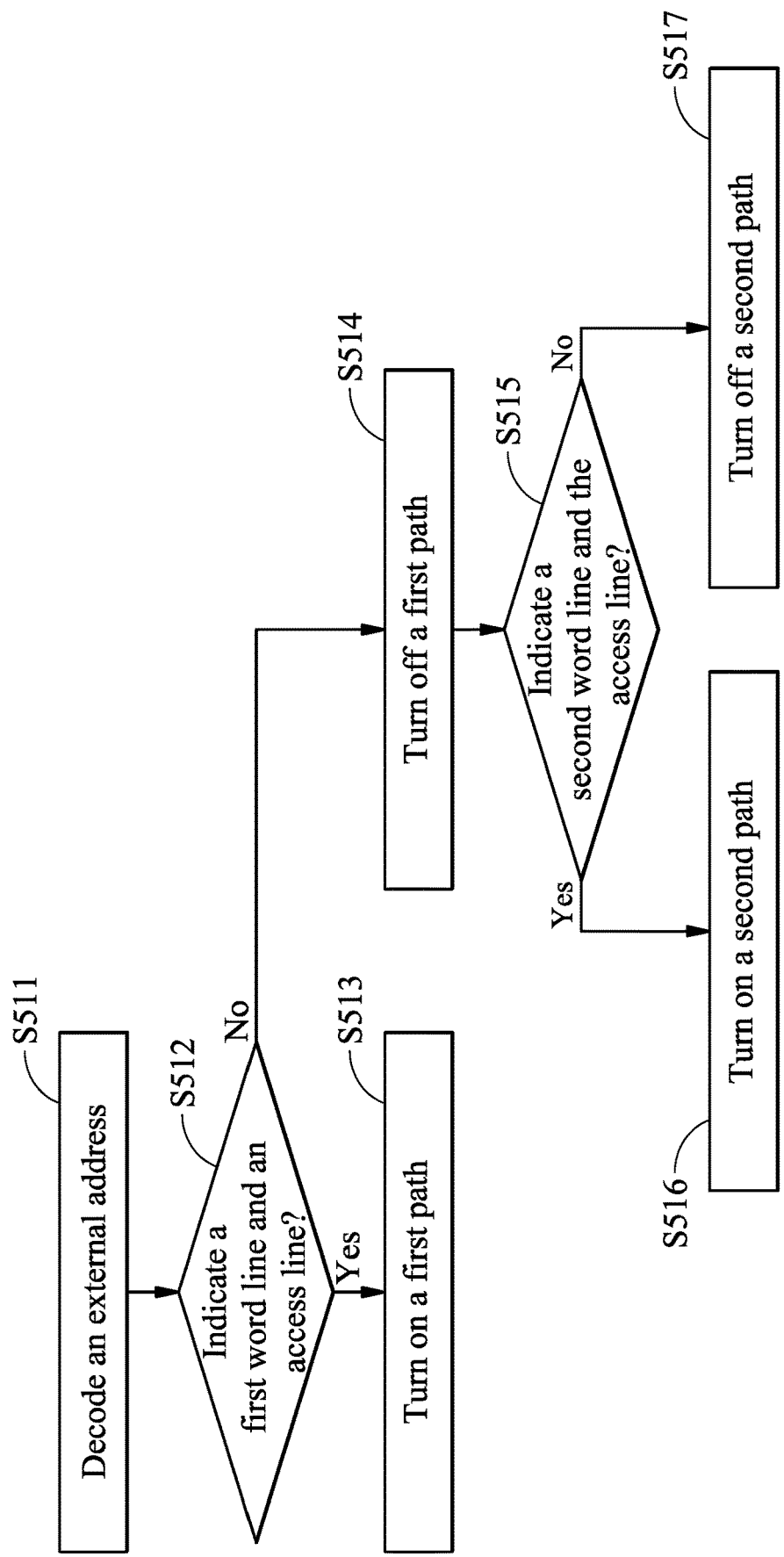
FIG. 5 is a flowchart of an exemplary embodiment of a control method according to various aspects of the present disclosure.

FIG. 5 is a flowchart of an exemplary embodiment of a control method according to various aspects of the present disclosure. The control method is applied to a memory chip.

First, an external address is decoded to generate a row address and a column address (step S511).

A determination is made as to whether the row address indicates a first word line and the column address indicates an access line (step S512). In one embodiment, step S512 determines whether the row address indicates the first word line according to the logic value of at least one specific bit of the row address. In another embodiment, step S512 determines whether the column address indicates to the access line according to the logic value of at least one specific bit of the column address.

When the row address indicates the first word line and the column address indicates the access line, a first path between a first memory cell and the access line is turned on so that the first memory cell outputs data to the access line via the first path (step S513). In other embodiments, step S513 may provide an access signal to the first word line and provide a refresh signal to a second word line. Therefore, the first memory cell coupled to the first word line performs an access operation, and a second memory cell coupled to the second word line performs a refresh operation.

When the row address does not indicate the first word line or the column address does not indicate the access line, the first path is turned off (step S514). Therefore, the first memory cell does not output data to the access line via the first path. In one embodiment, step S513 further provides the refresh signal to the first word line. Therefore, the first memory cell performs the refresh operation.

Next, a determination is made as to whether the row address indicates the second word line and the column address indicates the access line (step S515). When the row address indicates the second word line and the column address indicates the access line, a second path between the second memory cell and the access line is turned on so that the second memory cell outputs data to the access line via the second path (step S516). In one embodiment, step S516 turns off the first path between the first memory cell and the access line. Therefore, the first memory cell does not output data to the access line. In other embodiments, step S516 further provides the access signal to the second word line and provides the refresh signal to the first word line. Therefore, the first memory cell coupled to the first word line performs a refresh operation, and the second memory cell coupled to the second word line performs an access operation.

When the row address does not indicate the second word line or the column address does not indicate the access line, the second path is turned off (step S517). Therefore, the second memory cell does not output data to the access line via the second path. In one embodiment, step S517 further provides the refresh signal to the second word line. Therefore, the second memory cell performs the refresh operation.

In other embodiments, when the first memory cell or the second memory cell has not performed a refresh operation within a predetermined period, a refresh signal is provided to the first memory cell or the second memory cell so that the first memory cell or the second memory cell performs a refresh operation.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A memory chip, comprising:
at least one memory bank comprising:
a first sub-bank comprising a first memory cell coupled to a first word line and a first access line, wherein the first memory cell outputs data to the first access line via a first path; and
a second sub-bank comprising a second memory cell coupled to a second word line and the first access line, wherein the second memory cell outputs data to the first access line via a second path;
an address decoder circuit decoding an external address to generate a row address and a column address; and
a control circuit controlling the first path and the second path according to the row address and the column address,
wherein in response to the row address indicating the first word line and the column address indicating the first access line, the control circuit turns on the first path and turns off the second path and provides an access signal to the first word line and provides a refresh signal to the second word line.

2. The memory chip as claimed in claim 1, wherein in response to the row address not indicating the first word line or the column address not indicating the first access line, the control circuit turns off the first path, and in response to the row address indicating the second word line and the column address indicating the first access line, the control circuit turns off the first path and turns on the second path.

3. The memory chip as claimed in claim 1, wherein the control circuit comprises:
a selection circuit providing the access signal to the first word line and providing the refresh signal to the second word line in response to the row address indicating the first word line; and
a logic circuit turning on the first path and turning off the second path to direct the second memory cell to perform a refresh operation in response to the first word line receiving the access signal and the column address indicating the first access line.

4. The memory chip as claimed in claim 3, wherein the logic circuit comprises:
a first multiplexer comprising a first output terminal, wherein in response to the selection circuit providing the access signal to the first word line, the first output terminal outputs a first voltage level, and in response to the selection circuit providing the refresh signal to the first word line, the first output terminal outputs a second voltage level which is opposite the first voltage level;
a second multiplexer comprising a second output terminal, wherein in response to the selection circuit providing the refresh signal to the second word line, the second output terminal outputs the second voltage level, and in response to the selection circuit providing the access signal to the second word line, the second output terminal outputs the first voltage level;
a first logic gate coupled to the first output terminal and receiving the column address to turn on or off the first path; and
a second logic gate coupled to the second output terminal and receiving the column address to turn on or off the second path.

5. The memory chip as claimed in claim 3, further comprising:
a first amplifier circuit amplifying a voltage difference between a voltage of a first bit line and a voltage of a second bit line to generate first amplified data, wherein the first bit line and the second bit line are coupled to the first memory cell;
a switch circuit coupled to the first amplifier circuit and determining whether to transmit the first amplified data according to a row selection signal, wherein in response to the row selection signal being asserted, the switch circuit transmits the first amplified data, and in response to the row selection signal not being asserted, the switch circuit does not transmit the first amplified data; and
a second amplifier circuit configured to amplify the first amplified data transmitted by the switch circuit,
wherein:
the logic circuit generates the row selection signal according to the row address and the column address,
in response to the row address indicating the first word line and the row address indicating the first access line, the logic circuit asserts the row selection signal,
in response to the row address not indicating the first word line or the column address not indicating the first access line, the logic circuit does not assert the row selection signal.

6. The memory chip as claimed in claim 3, further comprising:
a first amplifier circuit amplifying a voltage difference between a voltage of a first bit line and a voltage of a second bit line to generate first amplified data, wherein the first bit line and the second bit line are coupled to the first memory cell;
a switch circuit coupled to the first amplifier circuit and determining whether to transmit the first amplified data according to a row selection signal, wherein in response to the row selection signal being asserted, the switch circuit transmits the first amplified data, and in response to the row selection signal not being asserted, the switch circuit does not transmit the first amplified data;
a second amplifier circuit configured to amplify the first amplified data transmitted by the switch circuit; and
a buffer circuit coupled between the switch circuit and the second amplifier circuit and determining whether to transmit the first amplified data transmitted by the switch circuit to the second amplifier circuit according to a control signal, wherein:
the logic circuit generates the control signal according to the row address and the column address,
in response to the row address indicating the first word line and the column address indicating the first access line, the logic circuit asserts the control signal to direct the buffer circuit to transmit the first amplified data transmitted by the switch circuit to the second amplifier circuit, and
in response to the row address not indicating the first word line or the column address not indicating the first access line, the logic circuit does not assert the control signal to direct the buffer circuit to stop transmitting the first amplified data transmitted by the switch circuit to the second amplifier circuit.

7. The memory chip as claimed in claim 3, further comprising:
a refresh counter configured to generate the refresh signal, wherein the address decoder circuit decodes the external address to generate the access signal,
wherein the address decoder circuit comprises:
a row decoder decoding the external address to generate the row address; and
a column decoder decoding the external address to generate the column address.

8. The memory chip as claimed in claim 3, further comprising:
a command decoder circuit configured to decode a command; and
a command address bus configured to provide the command to the command decoder circuit and provide the external address to the address decoder circuit,
wherein:
in response to the first memory cell not performing the refresh operation within a predetermined period, the selection circuit provides the refresh signal to the first word line so that the first memory cell performs the refresh operation.

9. A control method applied to a memory chip comprising a memory bank, wherein the memory bank comprises a first sub-bank and a second sub-bank, the first sub-bank comprises a first memory cell coupled to a first word line and an access line, and the second sub-bank comprises a second memory cell coupled to a second word line and the access line, comprising:
decoding an external address to generate a row address and a column address;
in response to the row address indicating the first word line and the column address indicating the access line:
providing an access signal to the first word line and providing a refresh signal to the second word line;
turning on a first path so that the first memory cell outputs data to the access line via the first path; and
turning off a second path so that the second memory cell does not output data to the access line via the second path.

10. The control method as claimed in claim 9,
wherein in response to the row address indicating the second memory cell and the column address indicating the access line:
the access signal is provided to the second word line;
the refresh signal is provided to the first word line;
the second path is turned on and the first path is turned off, wherein the second memory cell outputs data to the access line via the second path, and the first memory cell does not output data to the access line via the first path; and
in response to the first memory cell not performing a refresh operation within a predetermined period, the refresh signal is provided to the first word line so that the first memory cell performs the refresh operation.

* * * * *